United States Patent [19]

Yoda et al.

[11] Patent Number: 4,728,894
[45] Date of Patent: Mar. 1, 1988

[54] HIGH FREQUENCY COIL FOR AN NMR APPARATUS

[75] Inventors: Kiyoshi Yoda, Itami; Tadatoshi Yamada, Kobe; Satoshi Fujimura, Nara, all of Japan

[73] Assignee: Mitsubishi Denki Kabushiki Kaisha, Japan

[21] Appl. No.: 714,218

[22] Filed: Mar. 21, 1985

[30] Foreign Application Priority Data

Apr. 23, 1984 [JP] Japan .................. 59-80121

[51] Int. Cl.⁴ .............................................. G01R 33/08
[52] U.S. Cl. ...................................... 324/318; 324/322
[58] Field of Search .................... 174/152 A; 324/309, 324/318–319, 322; 336/199, 205–207, 225–227; 343/741–744, 871, 880

[56] References Cited

U.S. PATENT DOCUMENTS

| 3,504,104 | 3/1970 | Suzuki | 336/205 X |
| 3,761,933 | 9/1973 | Smalzer | 343/744 |
| 4,456,881 | 6/1984 | Compton | 324/309 X |
| 4,506,224 | 3/1985 | Krause | 324/319 |
| 4,517,516 | 5/1985 | Hill et al. | 324/318 |
| 4,594,566 | 6/1986 | Maudsley | 324/318 |

FOREIGN PATENT DOCUMENTS 0142760  5/1985  European Pat. Off. ............ 324/322

OTHER PUBLICATIONS

Cook et al, "A Large-Inductance, High-Frequency, High-Q, Series-Tuned Coil for NMR", *Journal of Magnetic Resonance*, 49, pp. 346–349, (1982).

Primary Examiner—Michael J. Tokar
Assistant Examiner—Francis J. Jaworski
Attorney, Agent, or Firm—Leydig, Voit & Mayer

[57] ABSTRACT

A high frequency coil for nuclear magnetic resonance comprises a saddle coil formed by interposing electric insulator members between adjacent ones of a plurality of metal straps. The metal straps are copper straps, and the electric insulator members are capacitors or air gaps.

12 Claims, 5 Drawing Figures

HIGH FREQUENCY COIL FOR AN NMR APPARATUS

BACKGROUND OF THE INVENTION

Nuclear magnetic resonance (NMR) has had its experimental technical fundamentals established conjointly with the rapid progress of electronic engineering in the past several decades, and has been applied to various research related to atoms, molecules, liquids, and solids. Especially in the fields of solid state physics and chemistry, NMR is an unequalled effective research means in the sense that materials can be understood from the microscopic point of view. NMR is a specific aspect of radio wave spectroscopy involving the use of only a uniform static magnetic field and a weak RF magnetic field for interaction with a measuring system.

Recently, research has been performed on the clinical application of NMR, i.e., tomography which employs the technology of NMR and image processing technology well known in X-ray CT (NMR Computerized Tomography: NMR-CT).

For the purpose of NMR observation, as illustrated in FIG. 1, a highly uniform static field $H_O$ (0.15 tesla at the highest) is generated by four solenoid coils or main coils MC1 through MC4 which are concentrically arranged in the form of a cylinder. Inserted inside the air-core coils is a Golay coil GC for a gradient field, which generates linear gradient fields along x-, y- and z-axes when the direction of the static field $H_o$ is assumed to coincide with that of the z-axis. Further, a saddle-shaped RF or high frequency coil SC which applies an RF magnetic field $H_1$ which is uniform in a wide range and in a direction orthogonal to the static magnetic field $H_o$ and with which an NMR signal can be observed is arranged inside the Golay coil GC.

Heretofore, the high frequency coil for NMR-CT of the type specified above has been as shown in FIG. 2. Referring to the figure, numeral 1 designates a copper tube which constitutes the high frequency coil, numeral 2 designates electrodes which are unitary with the copper tube 1 and which supply an RF current, and numeral 3 designates an RF magnetic field which results from the RF current caused to flow through the high frequency coil.

Since the conventional high-frequency coil for NMR is constructed as described above, it is necessary to bend the copper tube in accordance with predetermined dimensions, and it is not very easy to fabricate the copper tube with a predetermined accuracy.

SUMMARY OF THE INVENTION

This invention has for its object to provide a high frequency coil for NMR which can be readily fabricated. Accordingly, the present invention provides a high frequency coil comprising a saddle coil including a plurality of belt-shaped metal sheets, each having end portions. The plurality of metal sheets are arranged serially with an end portion of one metal sheet being disposed adjacent an end portion of the next metal sheet so as to form the saddle coil. The saddle coil further includes an electric insulation interposed between adjacent end portions of the belt-shaped metal sheets for reducing the impedance of the coil.

DETAILED DESCRIPTION OF THE PREFERRED EMBODIMENT

Figure 1:
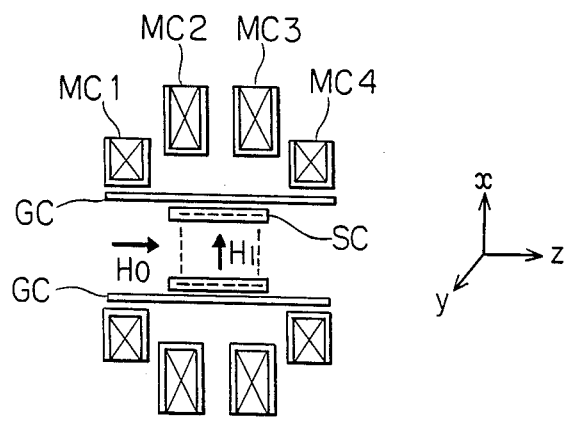
FIG. 1 shows the basic arrangement diagram of NMR-CT.
Figure 2:
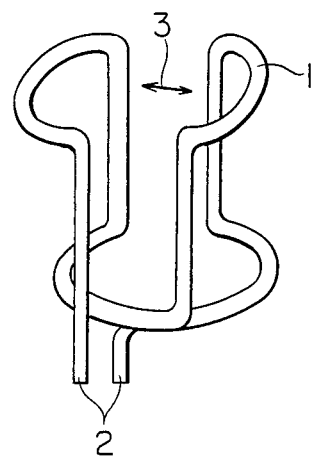
FIG. 2 is a perspective view showing a conventional high-frequency coil for NMR.

Now, one embodiment of this invention will be described with reference to a perspective view in FIG. 3. Referring to the figure, numerals 4 designate a plurality of metal straps made of, for example, copper sheets. The metal sheets 4 have opposite end portions and are arranged serially, an end portion of one metal sheet 4 being disposed adjacent an end portion of the next metal sheet 4 so as to form the saddle coil. Numerals 5 designate electric insulator members respectively interposed between the adjacent end portions of the metal sheets 4. Numeral 2 indicates electrodes similar to those in FIG. 2, and numeral 3 an RF magnetic field.

Next, the operation of the embodiment will be described. An RF current supplied across the electrodes 2 of the high frequency coil flows through the plurality of metal sheets 4 and the electric insulator members 5 situated between the metal sheets, with the result that the RF magnetic field 3 is generated.

Figure 3:
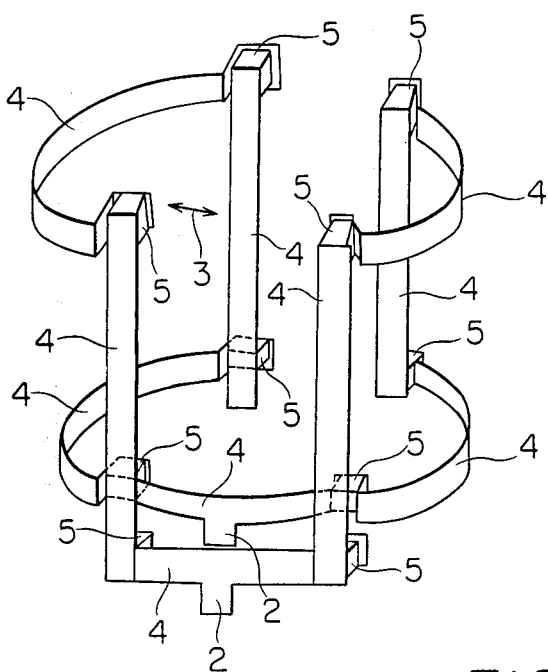
FIG. 3 is a perspective view showing an embodiment of this invention.
Figure 4:
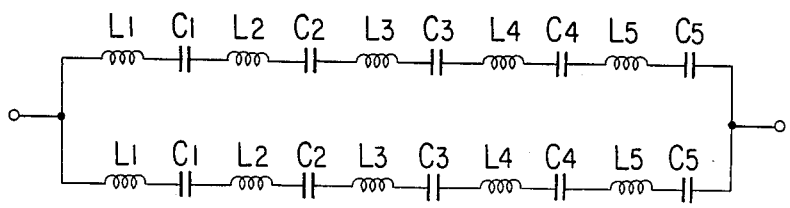
FIG. 4 is an equivalent electric circuit diagram of the embodiment shown in FIG. 3.

The embodiment of FIG. 3 can be depicted by the equivalent electric circuit shown in FIG. 4. Symbols $C_1$ to $C_5$ denote capacitances which are formed by the electric insulator members 5 and the two metal sheets 4 on both the sides thereof, and symbols $L_1$ to $L_5$ denote inductances which are formed by the respective metal sheets 4.

Figure 5:
FIG. 5 is an equivalent circuit diagram of the electric circuit diagram shown in FIG. 4.

Further, the electric circuit of FIG. 4 can be depicted by the parallel equivalent circuit shown in FIG. 5. The impedance Z of the equivalent circuit in FIG. 5 is $Z=j(\omega L - 1/\omega C)$. Therefore, since it has the parallel circuit of FIG. 4, the embodiment can equivalently reduce the inductance of the high frequency coils as compared with the inductance of the conventional high-frequency coil for NMR shown in FIG. 2. Additionally, since it has the insulator materials interposed between the metal sheets 4, the embodiment can further reduce the impedance of the coil by providing a capacitive reactance which subtracts from the inductive reactance.

Thus, in a case where an RF field generation detector for NMR in a comparatively high magnetic field is constructed using the high frequency coil of the embodiment, the arrangement of an impedance matching unit to be inserted between the high frequency coil and a high frequency transmitter/receiver connected thereto is facilitated.

Moreover, since the breakdown voltage of a variable capacitor for use in such an impedance matching unit is substantially proportional to the inductance of the high frequency coil, it can consequently be set at a lower magnitude. In turn, it is possible to miniaturize the variable capacitor itself and to miniaturize the impedance matching unit composed of the variable capacitor.

In this manner, according to the embodiment, the electric insulator members 5 are interposed between the plurality of metal straps 4 to form a saddle coil through which the RF current is caused to flow. As compared with the prior art, therefore, the invention facilitates the impedance matching of the high frequency coil and simplifies the fabrication of the NMR apparatus.

A solid or a gas can be used as the electric insulator of the members 5. When employing capacitors, e.g., chip capacitors commercially available as the solid electric insulator members 5, the capacitors and the corresponding metal sheets 4 are electrically connected by soldering, and when employing acrylic resin members, these members and the corresponding metal sheets 4 are bounded together with an epoxy adhesive. As other solid adhesives, a silicone adhesive or the like can be utilized. On the other hand, in case of employing air as the gaseous electric insulator of the members 5, the saddle coil is formed by providing gaps between the adjacent metal sheets 4.

While the material of the metal sheets has been copper in the foregoing embodiment, it may be another metal. In addition, the metal sheets and the solid electric insulator members have been described as being bonded together with an adhesive. Needless to say, however, in case of employing a bobbin (not shown) for the coil, the adhesion between the bobbin and the metal sheets is further required. Also, while the saddle coil has been formed of ten metal sheets 4 and ten electric insulator members 5 in the foregoing embodiment, the number of the constituent elements is not limited, and the way of splitting the saddle coil is a matter of design. Likewise, the shape of the connection portion between the metal sheet 4 and the electric insulator member 5 need not be restricted to that shown in FIG. 3.

What is claimed is:

1. A high frequency coil for a nuclear magnetic resonance apparatus comprising:
   a saddle coil including a plurality of belt-shaped metal sheets, each having end portions, the plurality of metal sheets being arranged serially with an end portion of one metal sheet being disposed adjacent to an end portion of the next metal sheet so as to form the saddle coil, the saddle coil further including electric insulator means for reducing the impedance of the coil, the electric insulator means being interposed between adjacent end portions of said belt-shaped metal sheets.

2. A high frequency coil for a nuclear magnetic resonance apparatus as defined in claim 1 wherein said metal sheets are belt-shaped copper sheets.

3. A high frequency coil for a nuclear magnetic resonance apparatus as defined in claim 1 wherein said electric insulator means are solids.

4. A high frequency coil for a nuclear magnetic resonance apparatus as defined in claim 3 wherein said electric insulator means are capacitors.

5. A high frequency coil for a nuclear magnetic resonance apparatus as defined in claim 4 wherein said capacitors are secured to said metal sheets by soldering.

6. A high frequency coil for a nuclear magnetic resonance apparatus as defined in claim 3 wherein said electric insulator means are acrylic resin members.

7. A high frequency coil for a nuclear magnetic resonance apparatus as defined in claim 6 wherein said acrylic resin members are secured to said metal sheets with an epoxy adhesive.

8. A high frequency coil for a nuclear magnetic resonance apparatus as defined in claim 1 wherein said electric insulator members are gaseous.

9. A high frequency coil for a nuclear magnetic resonance apparatus as defined in claim 8 wherein said electric insulator means are spaces of air.

10. A high frequency coil for a nuclear magnetic resonance apparatus as defined in claim 9 wherein said spaces of air are gaps provided between adjacent metal sheets.

11. A high frequency coil for a nuclear magnetic resonance apparatus as defined in claim 2 wherein said electric insulator means are solids.

12. A high frequency coil for a nuclear magnetic resonance apparatus as defined in claim 2 wherein said electric insulator means are gaseous.

* * * * *